US008487634B2

(12) United States Patent
Masters et al.

(10) Patent No.: US 8,487,634 B2
(45) Date of Patent: Jul. 16, 2013

(54) SMART ELECTRICAL WIRE-DEVICES AND PREMISES POWER MANAGEMENT SYSTEM

(75) Inventors: Gilbert J. Masters, Belmont, CA (US); Marcos S. Pernia, San Mateo, CA (US)

(73) Assignee: Enmetric Systems, Inc., Belmont, CA (US)

( * ) Notice: Subject to any disclaimer, the term of this patent is extended or adjusted under 35 U.S.C. 154(b) by 764 days.

(21) Appl. No.: 12/567,721

(22) Filed: Sep. 25, 2009

(65) Prior Publication Data

US 2010/0145536 A1   Jun. 10, 2010

Related U.S. Application Data

(63) Continuation-in-part of application No. 12/508,569, filed on Jul. 24, 2009, now abandoned, and a continuation-in-part of application No. 12/251,449, filed on Oct. 14, 2008, and a continuation-in-part of application No. PCT/US2008/079895, filed on Oct. 14, 2008.

(60) Provisional application No. 61/181,292, filed on May 27, 2009, provisional application No. 61/100,258, filed on Sep. 25, 2008.

(51) Int. Cl.
*G01R 31/08* (2006.01)
(52) U.S. Cl.
USPC .......................................................... 324/512
(58) Field of Classification Search
None
See application file for complete search history.

(56) References Cited

U.S. PATENT DOCUMENTS

| | | | |
|---|---|---|---|
| 4,399,510 A * | 8/1983 | Hicks | 705/412 |
| 4,686,380 A | 8/1987 | Angott | |
| 5,315,531 A | 5/1994 | Oravetz et al. | |
| 5,352,957 A | 10/1994 | Werner | |
| 5,483,153 A | 1/1996 | Leeb et al. | |
| 5,699,051 A | 12/1997 | Billig et al. | |
| 5,737,730 A * | 4/1998 | Alvarenga et al. | 705/412 |
| 6,226,600 B1 | 5/2001 | Rodenberg, III et al. | |
| 6,330,516 B1 | 12/2001 | Kammeter | |
| 6,874,691 B1 | 4/2005 | Hildebrand et al. | |
| 6,993,417 B2 | 1/2006 | Osann, Jr. | |

(Continued)

OTHER PUBLICATIONS

Ting et al.; "A Taxonomy of Load Signatures for Single-Phase Electric Appliances;" http://web.archive.org/web/20050105121725/http://lucent.us/pubs/2005-IEEE-PESEC-preprint.pdf; Jan. 2005.

*Primary Examiner* — Paresh Patel
(74) *Attorney, Agent, or Firm* — Sherman D. Pernia, Esq.

(57) ABSTRACT

Disclosed is power management system based on a "smart" wire-device installable in an electric power line (i.e., the "drop-grid" or "micro-grid") at a premises, such as a business or residence. The "smart" wire-device includes a management node integrated into the form of a typical electrical power outlet, circuit breaker or switch as would be found in such a premises, and is installable in the power line in a manner similar to existing wire-device. The "smart" wire-device requires no special skill to install beyond that of an ordinary skilled electrician. The present wire-device is "smart" in that the node has a detector circuit that senses the electrical characteristic(s) of the power line at the point at which it is installed. The node's communications circuit signals what it detects to a spatially separated remote controller device, and receives instructions from one or more spatially separated remote controller devices. The node's control mechanism operates a remotely controllable maker/breaker means in response to the received instructions to alter the condition of the electrical power output of the wire-device.

19 Claims, 11 Drawing Sheets

U.S. PATENT DOCUMENTS

| | | |
|---|---|---|
| 7,043,380 B2 | 5/2006 | Rodenberg, III et al. |
| 7,058,524 B2 | 6/2006 | Hayes et al. |
| 7,099,785 B2 | 8/2006 | Lee et al. |
| 7,133,845 B1 | 11/2006 | Ginter et al. |
| 7,276,915 B1 | 10/2007 | Euler et al. |
| 7,349,766 B2 | 3/2008 | Rodgers |
| 7,574,310 B2 * | 8/2009 | Kennedy et al. ........... 702/61 |
| 2002/0104031 A1 | 8/2002 | Tomlinson et al. |
| 2004/0254654 A1 | 12/2004 | Donnelly et al. |
| 2007/0051544 A1 | 3/2007 | Fernandez |
| 2007/0101173 A1 | 5/2007 | Fung |
| 2007/0213956 A1 | 9/2007 | Nasle et al. |
| 2007/0229376 A1 | 10/2007 | Desclos et al. |

* cited by examiner

ND PREMISES POWER MANAGEMENT SYSTEM

The present application claims the benefit of prior filed U.S. provisional applications Ser. Nos. 61/181,292 (expired) filed 27 May 2009 and 61/100,258 (expired) filed 25 Sep. 2008; and and U.S. non-provisional applications Ser. Nos. 12/508,569 (pending) filed 24 Jul. 2009 and 12/251,449 (pending) filed 14 Oct. 2008; and International Patent Application serial number PCT/US08/79895 filed 14 Oct. 2008, to which prior non-provisional applications the present application is a continuation-in-part, and all which prior applications are incorporated herein by reference.

FIELD OF THE INVENTION

The present invention is in the field of devices for measuring and testing of one or more electric properties, e.g., kilowatt hour demand/usage (Class 324) of a wire device. Specifically, the present invention relates to electrical usage measurement devices that sense electricity, per se, and signal the result of the measurement for exhibiting and/or processing (Subclass 76.11), and condition responsive control of the wire device.

BACKGROUND OF THE INVENTION

The motivation to improve usage efficiency has long existed in the electrical power field. Growing energy demand, escalating energy costs and a heightened awareness of both energy security and climate change have long driven interest in the field to improved energy efficiency as mechanism for mitigating the impact of the power industry on sustainability and the environment. In view of this, the utility industry has been motivated to develop and implement comprehensive energy efficiency systems that allow them to monitor a power grid's component devices in real-time (visibility) and to remotely control/manage (i.e., alter or redirect the power going to) those devices in real-time. Further, the visibility and control must include a substantial degree of "granularity," meaning that individual load components of the grid are visible to and controllable by the power management system. However, the electrical power distribution grids of electrical utility providers are not the only points at which meaningful electrical energy efficiencies need to be accomplished. It would be beneficial to the field if small electrical power consumers were similarly able to accomplish electrical usage efficiencies in the consumer's own premises power grid: the "micro-grid" represented by the consumer's premises (e.g., residence or place of business).

To accomplish a comprehensive, premises based energy efficiency program, it is necessary for the devices on premises power grid (the electrical wiring system on the drop-side of the utility provider's power metering device) to have real-time visibility and remote management capability for the small consumer analogous to the capacity the devices on a utility's distribution grid provide to the utility provider. In large industrial and commercial facilities, such visibility and control are often accomplish using very expensive proprietary hardware and software components not available to residential and small business consumers.

For premises, especially of residential and small business consumers, it would be beneficial if there were alternatives available in the way of off-the-shelf components and systems useful for accomplishing improved energy usage efficiencies, which components and systems do not require an inordinate amount of skill to install. The components of such a system as much as possible should resemble in structure and function, the existing components in the consumer's premises power grid. In other words, the new devices should be adapted to be readily retrofit into a premise' existing electrical lines to replace existing electrical appliance wiring devices. Additionally, the components should not require skill to install that is beyond that of ordinary electrician installer, and once installed should be unobtrusive in the environment of the premises. Further, the overall system and the remote system controller should be easy to understand, to implement and to operate—i.e., user friendly for the consumer.

Recently, products have been developed which attempt to address at least in part some of the aforementioned needs. Examples include: the "Kill-a-Watt" of P3 Industries (NY, N.Y.; www.p3international.com/products/special/P4400/P4400-CE.html), the "WattsUp" of Electronic Educational Devices (Denver, Colo.; www.wattsupmeters.com/secure/products.php), as well as the power plug and power strip device of U.S. Pat. No. 7,099,785. Although, these devices may be useful for their intended purpose, to visually monitor the electrical energy consumption of an individual appliance, these and similar devices do not enable the user to remotely (at a distance) monitor the device in a manner analogous to how a power company remotely monitors multiple devices. More importantly, these and similar devices do not enable the user to remotely control the device in a manner analogous to how a power company remotely controls devices on its power grid. Therefore, these types of device cannot accomplish the real-time visibility and remote management capability for the consumer, analogous to that which a utility has over the devices on its distribution grid.

Other products developed in the field for residential-type premises are useful for monitoring the "overall" energy usage of a premises or the "overall" energy usage of a single circuit breaker. However, these devices do not enable granular visibility and control of all or a substantial portion of individual loads on a premise' grid—it is not the individual load component or appliance that is monitored, only the usage of the line. The individual load components on the line are not visible. Therefore, these devices and the systems using them cannot provide the degree of granular visibility to residential user necessary to accomplish energy usage efficiencies analogous to that which a utility has over its distribution grid. Examples of this limited type of device are set forth in U.S. Pat. No. 7,043,380 to Rodenberg et al. and U.S. Pat. No. 7,263,450 to Hunter.

Rodenberg discloses a distribution panel circuit breaker monitoring device wherein the overall power usage of the drop-side of the breaker is monitored, but which cannot monitor the usage of the individual appliances on the drop. Therefore, the Rodenberg device fails to provide the granular visibility analogous to a utility provider's efficiency system. Hunter discloses an optical automatic meter reader, a data collector and a computer. The meter reader attaches outside of an existing utility meter and senses power usage, and the data collector stores power usage data obtained via the meter communicates the data to the computer for viewing by the user. The computer provides a centralized object through which the user views power consumption. The Hunter device and system only monitors overall power usage of the drop-side of the utility service meter. It cannot monitor the usage of the individual appliances on the drop. Therefore, the Hunter device also fails to provide the granular visibility analogous to a utility provider's efficiency system.

However, it would be beneficial if a system were available to a consumer micro-grid that provided visibility and control of energy usage across the micro-grid, without needing to utilize bespoke form-factors and configurations that do not accommodate simple retrofit, and that do not require custom wiring and installation. It would be further useful to have available such devices as would allow the consumer's micro-grid to interface with a local ("on the micro-grid") power source, such as a battery bank or photo-voltaic array.

SUMMARY OF THE INVENTION

The present invention is a premises based electricity power usage management system utilizing "Smart Wire-Devices" (SWD). The management system integrates one or more smart wire-form device circuits to enable the measurement of electrical power usage data (of a wire-form electrical load interface such as a wall outlet, light switch, circuit breaker, etc.), and to transmit the data to a signal processor distally separated from the wire-form device circuits. The smart wire-device is a remotely controllable, condition sensing wire-device installable on the drop-side of the electric power line, i.e., the micro-grid of a premises. The smart wire-device measures an electrical property of the electric power line, such as: line current; line voltage; line frequency; electrical ground condition; wattage; line power factor; line electrical noise; and line impedance.

The condition sensing wire-device comprises a current-carrying electrical appliance wiring-device form component and a management node. The current-carrying electrical appliance wiring-device has a locally controlled maker/breaker means for opening and closing the electric power line to provide power to the appliance connected to it. The current-carrying electrical appliance wiring-device typically is in a form similar to a wall outlet, a surface-mount electrical switch (e.g., a wall switch) and/or an electrical circuit breaker.

The management node includes a control mechanism, a sensing circuit, and a communications circuit. The control mechanism has a remotely controllable maker/breaker means—separate from the locally controlled maker/breaker means of the electrical wiring-device. The remotely controllable maker/breaker means of the management node controls the condition of the node's control mechanism in response to an internal device signal from the communications circuit. The sensing circuit is in electrical communication with the electric power line and the control mechanism. The sensing circuit measures one or more electrical properties of the electrical line, and as a result of the measuring and the sensing, it generates an internal device signal and sends the signal to the communications circuit. The communications circuit is adapted to receive, process and route the signals it receives from the sensing circuit (and other sources), and to transmit external output to a spatially separated, remote signal processing device via an I/O interface port, and to receive external input signals via the I/O port.

The management node is physically integrated with the electrical appliance wiring-device to provide the condition sensing wire-device of the present invention in a unitary form.

Another advantage of the present invention is accomplished in the situation where the premises micro-grid includes a local source or store of electrical power, such as a local photo-voltaic array or a battery bank. Local, on-site generation of electricity, via solar photo-voltaics (PV's), wind, hydroelectric, etc. is an increasingly important source of power for most electrical power distribution systems. The ability to monitor and control these methods of local generation is necessary in order to maximize the effectiveness of the system. Locally generated electricity often is provided as DC power (e.g., from a battery or a PV source). In these cases, a DC-AC inverter is required to convert the DC power to AC power typically used on a premises micro-grid. A "smart" inverter embodying the management node of the present invention provides a solution for monitoring, and control of a local DC power source. By measuring the electrical characteristics (power, voltage, current, phase, frequency, power factor, etc.) at both the input and output of the inverter, measurements for the power generated, power supplied, and inverter efficiency and phase-locking can be provided. Control at the inverter location provides the ability to electrically disconnect, shunt, or otherwise limit/vary the amount of electrical power supplied.

Additionally, the ability to communicate with the inverter allows the inverter to be networked into the present power management system. The management node of the smart inverter provides the ability to communicate with the present power management system via the described I/O methods. The smart inverter management node can also communicate directly with the inverter's internal circuitry via an integral serial connection. This provides the inverter with the ability to communicate to the user data in addition to data from the sensors 46a, 46b; additional data such as: inverter circuitry state, inverter health, and diagnostic data related to the inverter circuitry.

Furthermore, it is an advantage of the present system to provide a means accomplishing the reverse operation of the inverter: i.e., a rectifying device which converts the AC power of the micro-grid to DC power for use or storage locally. This is accomplishable by substituting a rectifying device for or adding a rectifying device to the inverter element 22 in FIG. 9. The rectifying device in practice can be used, for example, to charge a battery bank or other energy storage mechanism. The rectifying device will benefit from the aforementioned monitoring and control capabilities provided by the management node.

DETAILED DESCRIPTION OF THE INVENTION

Figure 1:
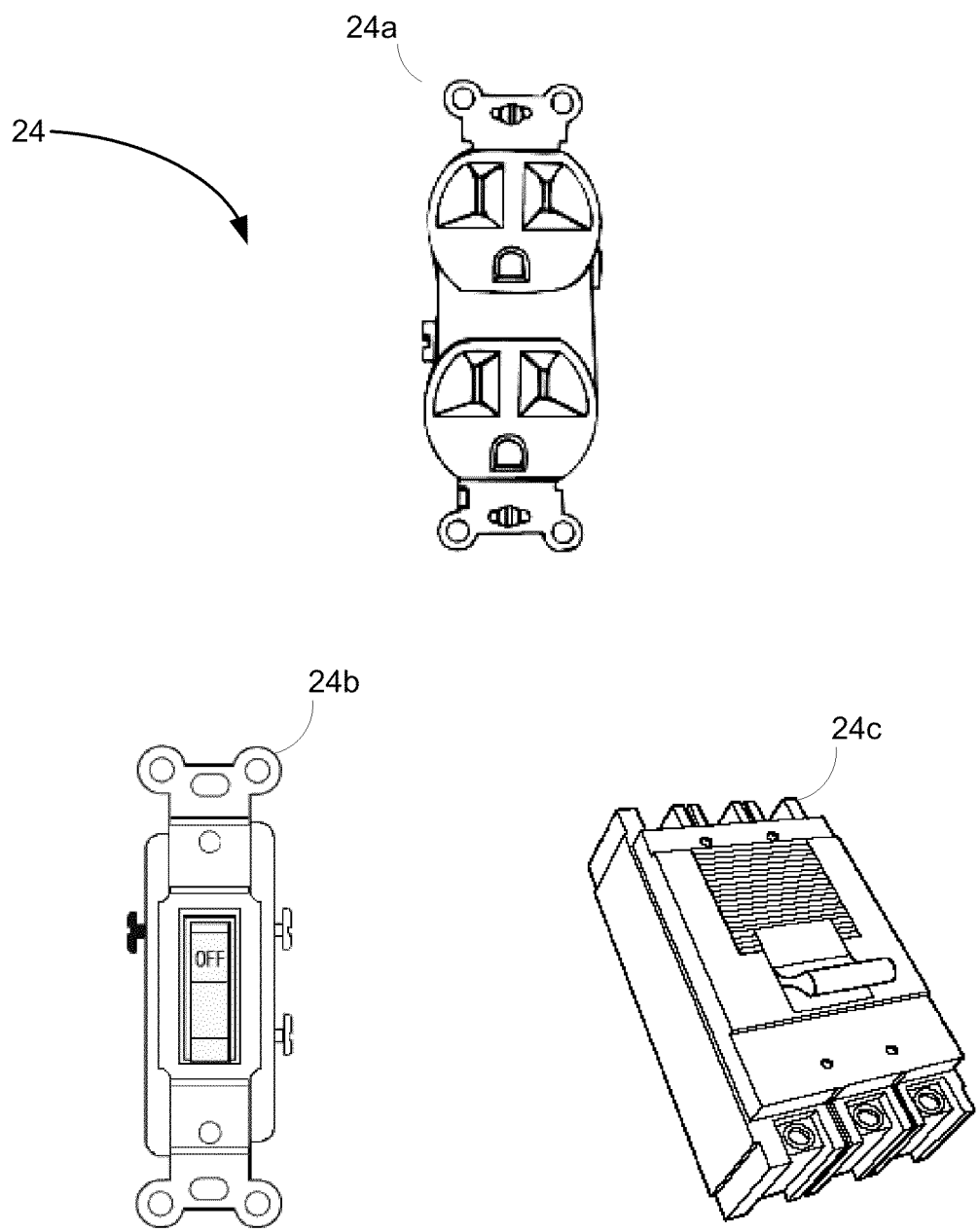
FIG. 1 is a schematic representation of prior current-carrying electrical appliance wiring-forms which are practicable in the present Smart Wire-Device.

Referring now to the drawings, the details of preferred embodiments of the present invention are graphically and schematically illustrated. Like elements in the drawings are represented by like numbers, and any similar elements are represented by like numbers with a different lower case letter suffix.

Figure 2:
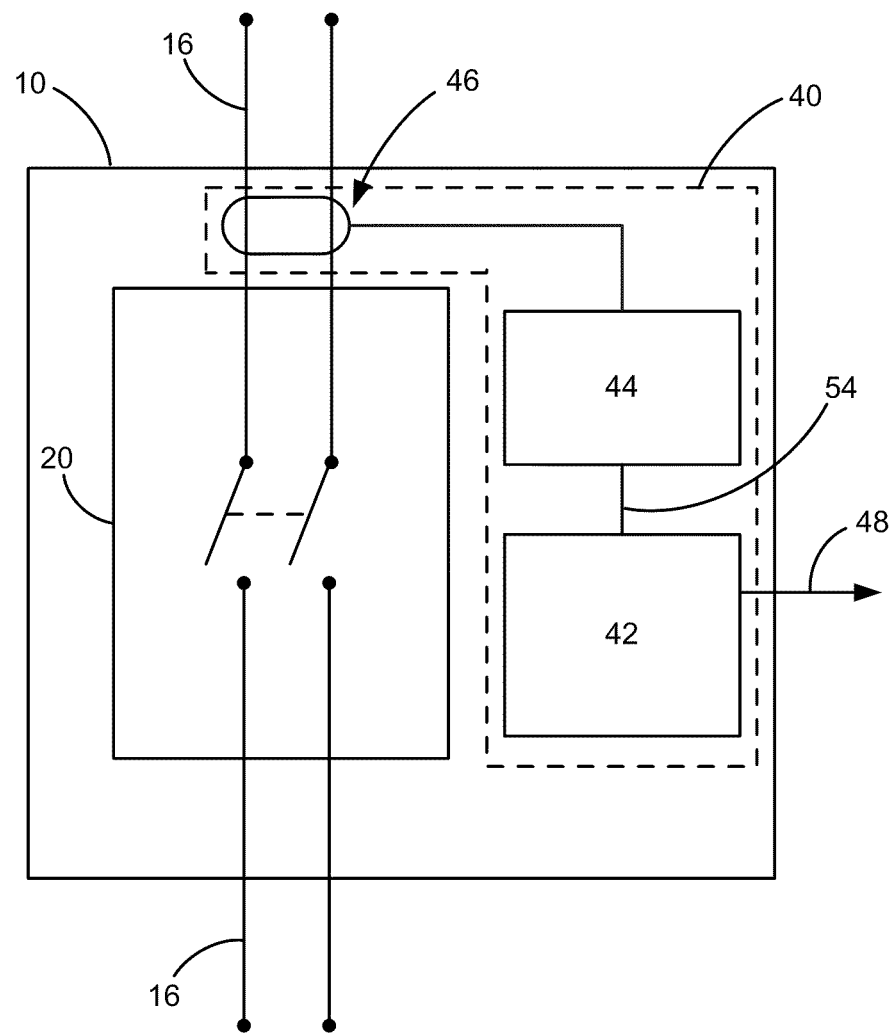
FIG. 2 is a schematic representation of a preferred embodiment of the Smart Wire-Device of the present invention, wherein the node of the Smart Wire-Device measures a condition of the power line and communicates the result of the measurement (directly or indirectly) to a remotely located processor.

Referring now to FIG. 2, a preferred embodiment of the present invention is a Smart Wire-Device 10. The Smart Wire-Device 10 is intended to be installable in an electric power line 16 at a consumer premises, i.e., on the drop-side of the electrical utility service at an end consumer's location (premises). An end user's location is the consumer's business premises, residence, shop location and the like. In this embodiment, the Smart Wire-Device 10 is used for measuring an electrical property of the consumer premises electric power line 16 at a point in the power line 16, and to communicate that measurement to an external device (such as a receiver/processor, computer device 160, 165 (see FIG. 7) or another smart wire-device 10) spatially distant from the subject Smart Wire-Device 10. The Smart Wire-Device 10 comprises a management node 40 in combination with a current-carrying electrical appliance wiring-form 20 (see FIG. 1). The types of current-carrying electrical appliance wiring-forms 20 intended to be practiced in the present invention are, in part, defined in the 2007 NAICS table of industry definitions as a class 335931 Current-Carrying Wiring Devices. The management node 40 comprises a sensing circuit 44, and a communications circuit 42, which in combination provide for detecting a "condition" of the electrical power line 16 at the point at which it is installed and communicating that condition to a remote receiver/processor.

A current-carrying electrical appliance wiring-form 20 is a means for regulating the flow of electricity through the electric power line 16 at the point at which it is installed in the line 16. Examples of such prior art wire-form are set forth in the 2007 NAICS table of industry definitions as a class 335931 Current-Carrying Wiring Device. In a prior art wiring form, this regulation typically consists of simply opening and/or closing the electric power line 16 at the point of installation in response to a manual operation, such as operating a wall switch or connecting a power cord to an electrical outlet.

The management node 40 is an electronic device that comprises at least a sensing circuit 44 and a communications circuit 42. In a preferred embodiment, the management node 40 has a unique identifier ("ID") linked to it. The unique ID can be assigned during the production process, or can be assigned later (either manually or dynamically). The unique identifier allows the system to identify individual nodes 40 on a network of nodes 45 (see FIG. 7), and enable the present system to perform its networking functions. The sensing circuit 44 communicates with the electric power line 16 and detects/measures an electrical property of the electrical line 16. The result of the detection/measurement (and any other sensor output) is sent as an internal device signal 54 from the sensing circuit to the communications circuit 42. The communication circuit 42 receives and processes the internal device signal 54 from the sensing circuit 44 (and other internal device signals) and outputs a processed signal to a remote signal source and processor device (e.g., remote computer 160, 165 in FIG. 7) such a remote controller device via a signal output port 48.

The management node 40 feature of the Smart Wire-Device 10 is not to be confused with a "load-shedding" device. Load-shedding is defined as: cutting off the electric current on certain lines when the demand becomes greater than the supply. See: wordnetweb.princeton.edu. The purpose of a load-shedding device is to automatically shut-off the attached appliance when (a) a preset level of electricity consumption is reached or (b) at a scheduled time. For example, see U.S. Pat. No. 7,043,380. In contrast, in a preferred embodiment the present management node 40 provides more granular control of the attached appliance by enabling the user to communicate with it to accomplish a repertoire of control features (such as varying the power, the duty cycle or the operational state of the attached appliance) in addition to merely shutting off power to the appliance.

In practice, the management node 40 is physically integrated with the electrical appliance wiring-form 20 to provide the Smart Wire-Device 10 of the present invention as a single unit. It is intended that the integrated unit generally resembles the prior wire-form it replaces in both its appearance and how it is installed in a premises electrical power line 16. In other words, the present Smart Wire Device 10 outwardly resembles a prior wire-form in looks and in the manner by which it is installed in a premises electrical power line 16. However, the Smart Wire-Device 10 substantially differs from the prior wire-forms it replaces in its internal structure and the scope of its operation, its utility and its functions.

Figure 3A:
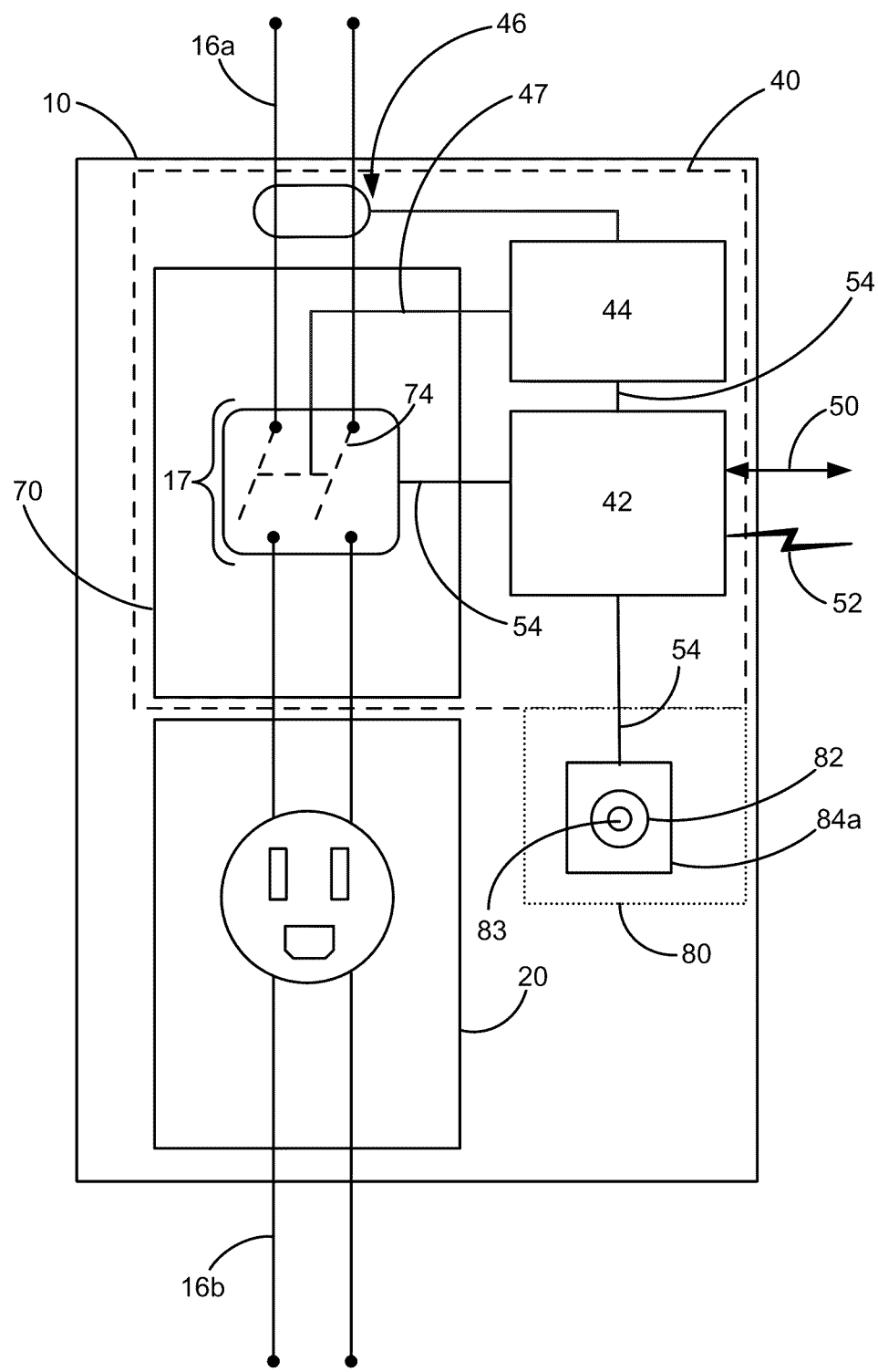
FIG. 3A is a schematic representation of another preferred embodiment of the present Smart Wire Form as in FIG. 2, additionally having a management capability remotely controllable from a spatially separated location.

In an additional preferred embodiment illustrated in FIG. 3A, the management node 40 of the Smart Wire-Device 10 further comprises a control mechanism 70. The control mechanism 70 has its own circuit maker/breaker means 74 separate from the maker/breaker means of the electrical wiring-form 20. Additionally, the control mechanism maker/breaker means 74 is connected to the communications circuit 42, allowing the control mechanism maker/breaker means 74 of the control mechanism 70 to be in communication with and operated by a signal from the comm. circuit 42. In turn, the comm. circuit 42 in this embodiment is adapted for two-way external communication (for example, with a remote signal processor, e.g., a remote computer 160, 165 in FIG. 7) via either or both of its I/O ports 50, 52. This external communication feature enables the separate maker/breaker means 74 of the control mechanism 70 to be controlled by a signal from a remotely located signal source. In other words, the condition of the maker/breaker means 74 (e.g., off/partial-on/full on) is remotely controllable by a remotely generated signal sent to the management node 40 via the communications circuit 42. In this embodiment, the communications circuit 42 is adapted to receive, process and route internal device signals 54, and to transmit output signals and receive input signals via the communication ports 50, 52.

The communications circuit 42 of the management node 40 is adapted to communicate an output signal via a hard-wire I/O interface 50 and/or via a wireless I/O interface 52. Hard-wire and wireless interfaces are known to the ordinary skilled artisan and include hard-wired interfaces such as PLC, USB, Ethernet, etc., and wireless interfaces such as Zigbee, WIFI, radio, etc. However, in the preferred embodiment of the communications circuit 42 exemplified in FIG. 3A, both hard-wired 50 and wireless 52 I/O communication interfaces are available for receiving and sending external communications. FIGS. 4A-4D illustrate a benefit of this dual I/O interface feature of the communication circuit 42, which is that it imparts a "fault-tolerant" capability to management node 40 communications. The fault-tolerance feature is accomplished by the communication circuit 42 of the Smart Wire Device 10 having multiple selectable communication modalities operating in parallel (for example: Power Line Communication (PLC), ZigBee and serial/USB communications). Additionally, individual management nodes 40 are capable of bridging between supported communication protocols and mediums such as between a power line communications (PLC) interface and a radio, Ethernet or USB interface. In use, an interface priority may be pre-established or elected for the available communication modalities, based on criteria established by associated software, such as ordering; real-time quality of the com interface (e.g., noise; line loss, etc.) and other known criteria. These can be established by software and/or firmware and associated variables derived from routing tables, priority queues, etc. This can result in some or all of the signals received via a first com interface 50 being bridged to an alternate com interface 52 of the communications circuit 42, as dictated by the communications interface priority criteria.

Figure 3B:
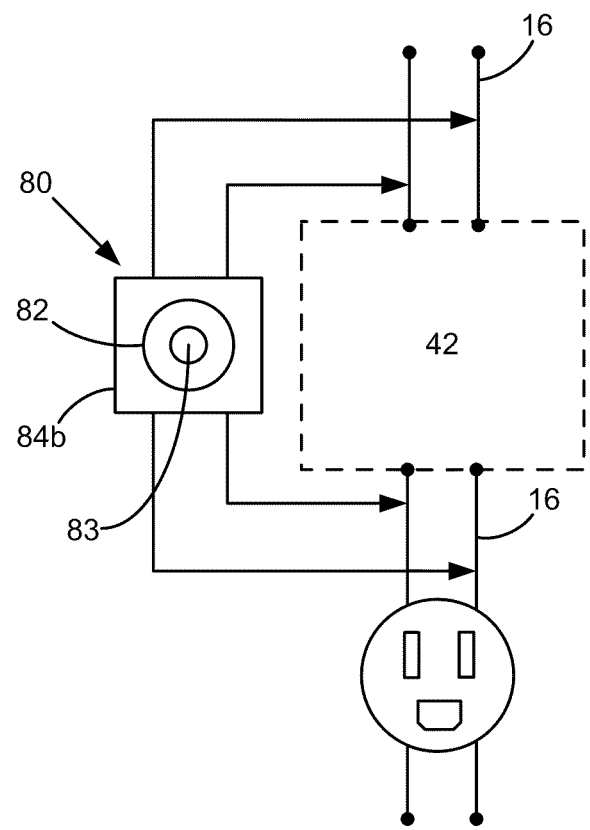
FIG. 3B is a schematic representation of a portion of the embodiment of FIG. 3A, but including an electronic manual override mechanism accessible by a user.
Figure 3C:
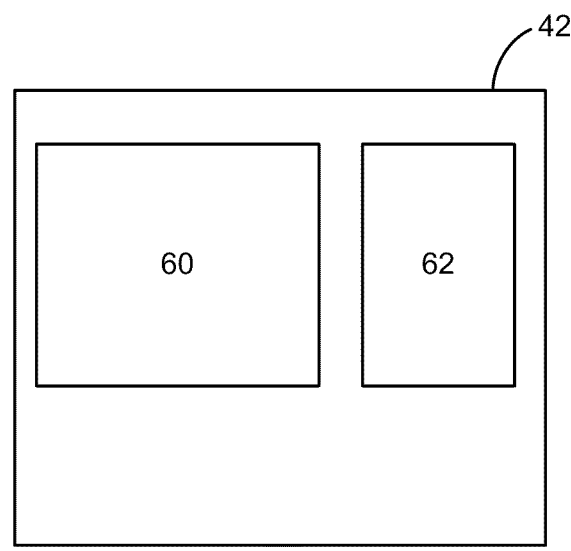
FIG. 3C is a schematic representation of an alternative embodiment of FIG. 3A, in which the communications circuit includes a processor with appropriate circuitry and memory.

In an alternative preferred embodiment shown in FIG. 3C, the communications circuit 42 includes a processor 60 with appropriate circuitry and memory 62. The memory 62 may be of a form known to and selectable by the ordinary skilled artisan, such as volatile and non-volatile memory means. Examples of such memory means include: flash memory; a solid state drive (SSD); a hard drive; or some other form of memory. As shown in FIG. 3C, the processor 60 and memory 62 are integrated into the communications circuit 42. However, this convention is used here for clarity purposes only, as the processor 60 and/or memory 62 could be completely separate circuits or could be practiced as disbursed circuits.

The electrical appliance wiring-form 20 is a consumer-appliance electrical circuit maker/breaker 24 for connecting an electrical consumer appliance to an electrical power line 16 on the premises (see FIG. 1). The consumer-appliance electrical circuit maker/breaker 24 can have the form of any of a number of commonly available electrical appliance wiring-device forms, such as: an electrical outlet 24a; a surface-mount electrical switch 24b; an electrical circuit breaker 24c; additionally including an electrical appliance cord plug; an electric plug adaptor; an electrical lamp socket; an electrical power strip, and in-line electrical switches (not shown). The intended appliance wiring-forms 20 of the present invention are of the type that are installable at the consumer's premises in the electric power line 16 on the drop-side of the utility service's metering device 610 (see FIG. 5).

The sensing circuit 44 of the management node 40 includes one or more line sensors 46 adapted to enable the sensing circuit 44 to detect and/or measure one or more electrical properties of the electric power line 16 at the point at which the Smart Wire-Device 10 is installed. Relative to the wiring-form 20, a line sensor 46 of the sensing circuit 44 can be placed in either the line-side 16a or the drop-side of the electrical power line 16, as selectable by the ordinary skilled artisan. An appropriate electrical property of the power line 16 to be measured is selectable by one of ordinary skill in the art. Such electrical properties include: line current; line voltage; line frequency; electrical ground condition; wattage; line power factor; line electrical noise; and line impedance. Additionally, the sensor circuit has utility in aiding the communication circuit's "self-healing" (see below) capability. For example, the sensor circuit 44 may detect electrical characteristics of the AC power line 16 that are satisfactory for power line communications (PLC), or that are unsatisfactory and PLC should be avoided, as determined by software instruction associated with the processing circuit 60. As an aside, it is to be understood that the processor 60 and the memory 62 features of the present invention have appropriate associates instruction sets (software and/or firmware) to enable the invention to accomplish its intended purpose.

Additionally, in the embodiment exemplified in FIG. 3A, the sensing circuit 44 of the management node 40 includes a self-sensor 47 adapted to enable the management node 40 to sense the condition of the control mechanism maker/breaker means 74 of the control mechanism 70. In practice, the remotely controllable maker/breaker means 74 is operable in response to an internal device signal 54 from the communications circuit 42 to control the condition or setting of the control mechanism 70 by opening and closing a node portion 17 of the electrical power line 16. The remotely controllable maker/breaker means 74 is operable in response to the internal device signal 54 to accomplish a number of effects on the drop-side of the node portion 17 of the electrical power line 16. In addition to opening and closing to control continuity of the node portion 17 of the power line, remotely controllable maker/breaker means 74 can be adapted to alter an electrical property of the electrical power line drop 16b without fully opening or breaking the node portion 17. For example, controllable maker/breaker means 74 can be adapted to voltage or current limit the power line at the node portion 17 in the manner of a dimmer switch, potentiometer, rheostat or other means of varying electrical power known one of ordinary skill in the art. In a similar manner, the duty cycle of the power line 16 can be varied. It should be noted that although the control mechanism 70 is shown in the figures on the line side of the wiring-form, it can be disposed on the drop side of the wiring-form as selectable by the ordinary skilled artisan.

Another featured that enhances the benefits of certain embodiments of the present Smart Wire-Device 10 of the present invention is a manual override mechanism 80 (see FIGS. 3A & 3B). The manual override mechanism 80 is mounted on the Smart Wire Device 10 to be accessible to the user, and adapted to allow the user to disable or otherwise alter the action of the management node 40, e.g., to simply bypass the management node 40, change the operating state of the node 40, put the node 40 in a discovery mode, etc. Many types of override mechanisms are known to and selectable by one of skill in the art for practice in the present invention. The override mechanism 80 has a user interface 82, such as a button, a switch or jumper to allow a node 40 to be reset to a known state, or to manually disable/enabling at least one function of the node 40. The override itself can be an electronic override circuit 84a (see FIG. 3A) or a mechanical override 84b (see FIG. 3B). Optionally, the override mechanism 80 can include a "tell-tale" 83 to indicate the condition or current setting of the override mechanism 80. In figures, the "tell-tale" 83 is exemplified as an LED which is energized when the override 80 is activated.

Figure 3D:
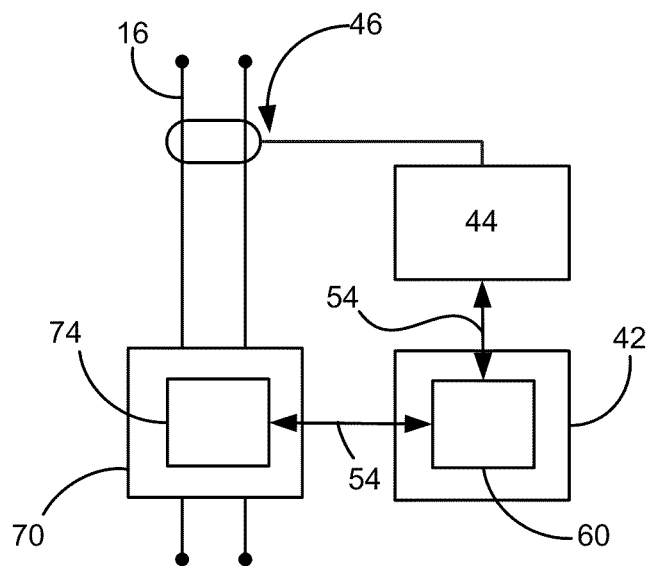
FIGS. 3D and 3E illustrate the feed-back loop feature of the management node.
Figure 3E:
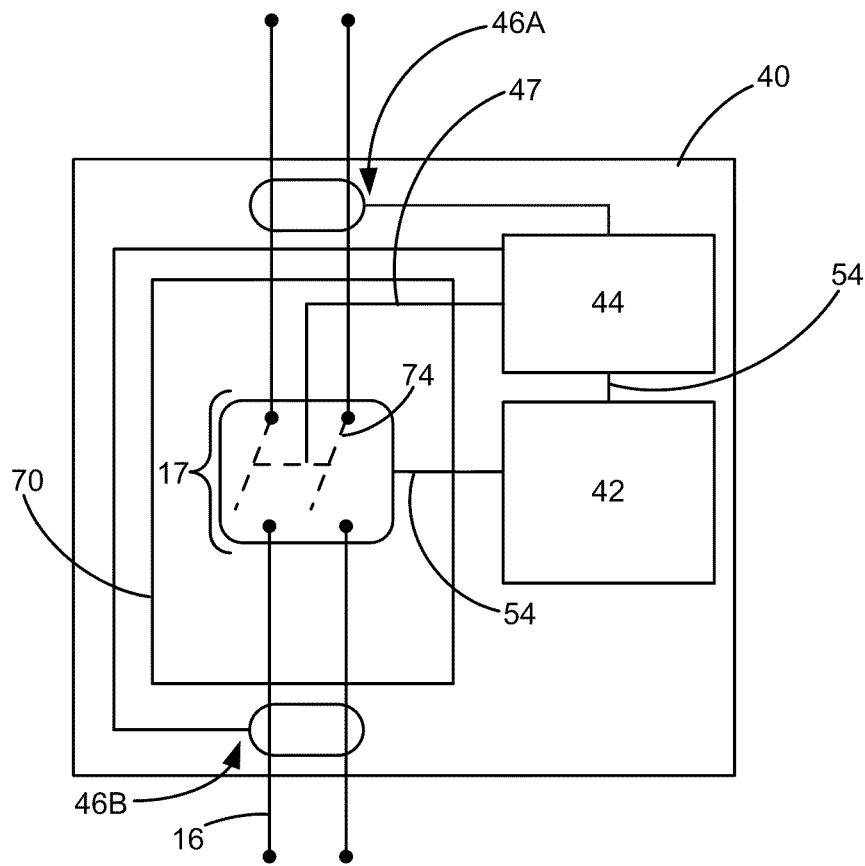
Figure 4A:
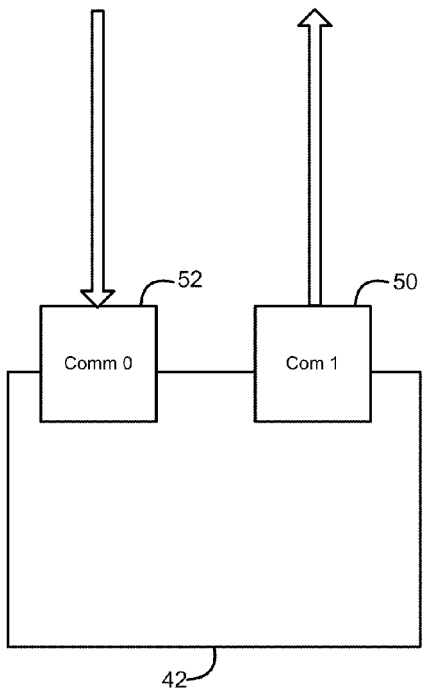
FIGS. 4A-4D are schematic representations of the communication interfaces of a communication circuit in various I/O modes.
Figure 4B:
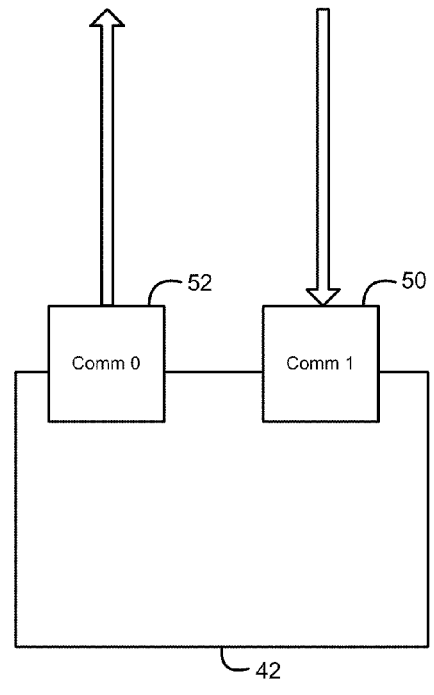
Figure 4C:
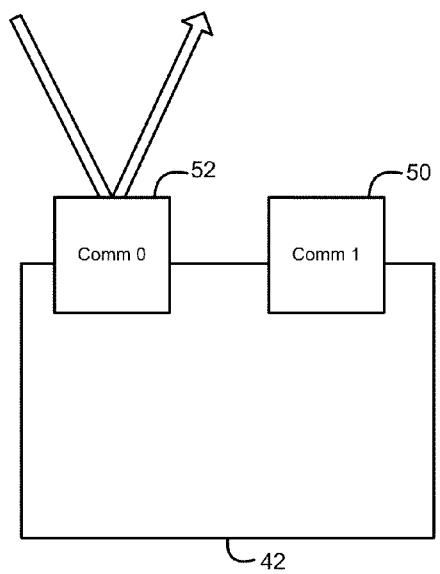
Figure 4D:
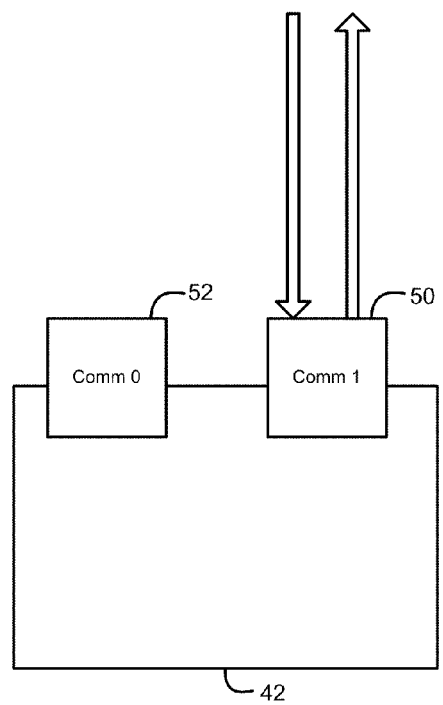

A further featured that enhances the benefits of certain embodiments of the present invention is the sensor circuit 42 being adaptable to aid the control mechanism and associated circuitry 70 in accomplishing certain functions. For example, as shown in FIG. 3D, a feedback loop is created between the sensors 46 of the sensing circuit 44, the processor 60 of the communications circuit 42 and the controllable means 74 of the control mechanism 70. Feedback of power line 16 conditions through the sensor circuit 44 can cause the processor 60 to continuously monitor and control the electrical power provided to the wire device 20. Similarly, the feedback feature provides "intelligence" to the Control mechanism 70 feature by enabling it to cycle the power load at opportune moments, such as at the AC sine wave zero crossings. As illustrated in FIG. 3E, a plurality of sensors 46a, 46b may be included in the sensor circuit 44 of the management node 40.

Figure 5:
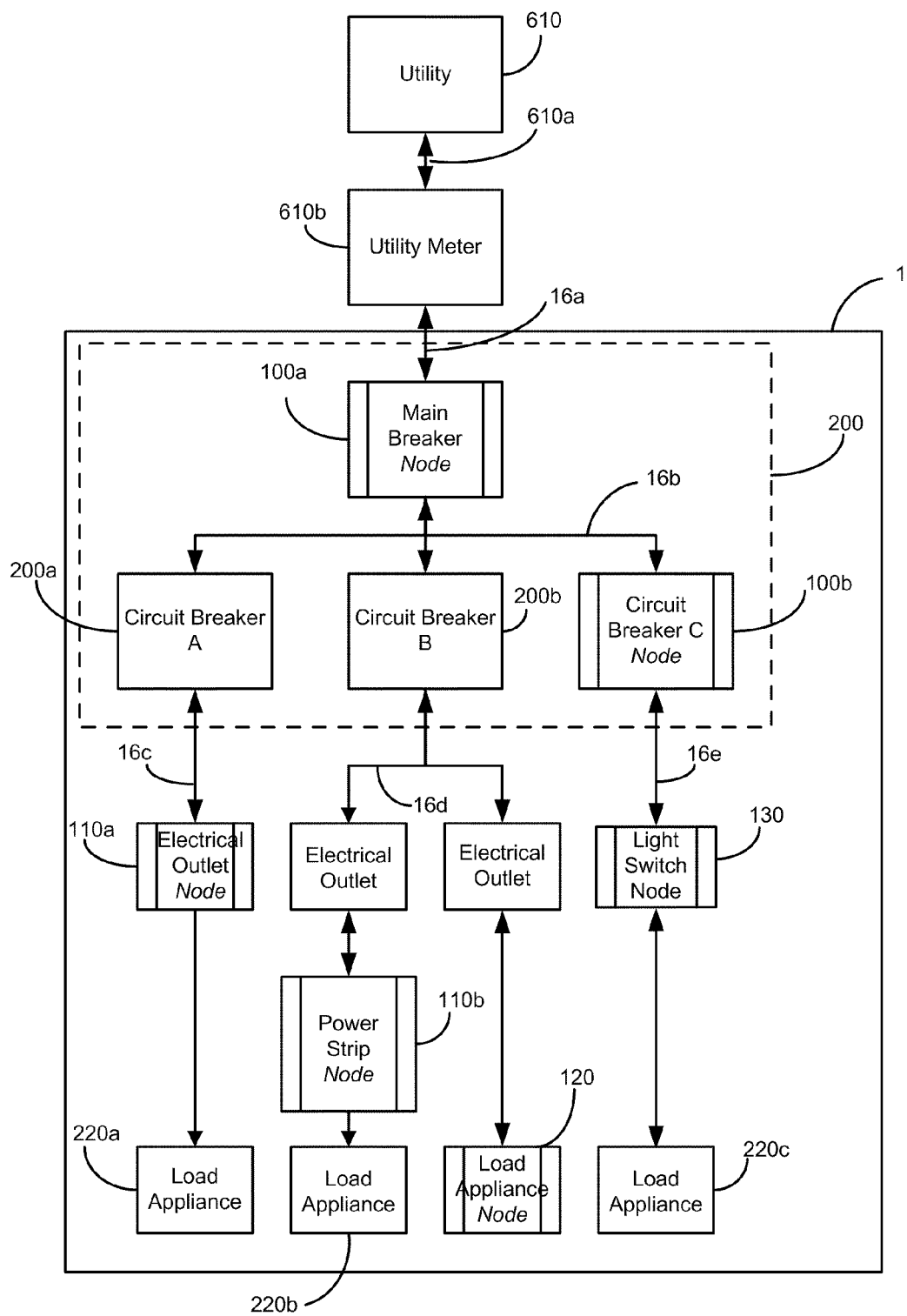
FIG. 5 is a simplified illustration of a typical residential electrical system on which SWD/Management Nodes have been implemented.

FIG. 5 illustrates of a typical Electrical Power Management System of the present invention on which SWD/Management Nodes have been implemented. In the present system, electrical power is delivered to the user consumer by a utility service provider 610 via utility lines 610a and the consumer's electrical energy usage is monitored by the utility using a metering device 610b installed at the consumer's premises. In the present system, the electricity metering device 610b feeds power directly into the micro-power grid (micro-grid) 1 of the consumer's premises. Typically, this includes: a distribution panel 200, which usually contains a main circuit breaker 100a and a plurality of distribution circuit breakers 100b, 200a-b. The distribution circuit breakers 100b, 200a-b then feed electrical power to any number of electrical appliance wiring-devices throughout the micro-grid 1, which in turn connect to any number of load appliances 120, 220a-c, such as a washing machine or a water heater, etc.

In practicing the present Electrical Power Management System, a smart wire-device 10 including a management node 40 is installed at any point along a power line 16a-e of the micro-grid 1 between (or within) a load appliance 120, 220a-c and the electrical power source (e.g. the utility meter 610b). This will provide the end user with a multitude of options for measuring and controlling electrical energy usage across the entire premises micro-grid 1, from the highest level down to a very granular level. For example, to manage and control the electrical energy usage of a typical plug-in type load appliance, such as a television or desk lamp, the load appliance may be plugged into a smart wire-device 10 configured as a standard wall-outlet 110a. Similarly, the load appliance may be plugged directly into a smart wire-device 10 configured as a multi-plug/power-strip device 110b. Additionally, a management node 40 may be integrated directly into the load appliance itself 120. Management of non-pluggable loads, such as built-in lighting and large appliances like washing machines, clothes dryers, etc, may be managed by management nodes 40 integrated into switches, dimmers, or similar wiring-devices 130; by management nodes 40 integrated into circuit breakers 100b, or by management nodes 40 integrated directly into the load appliance itself 120. It can be seen that many possible configurations are possible.

Figure 6:
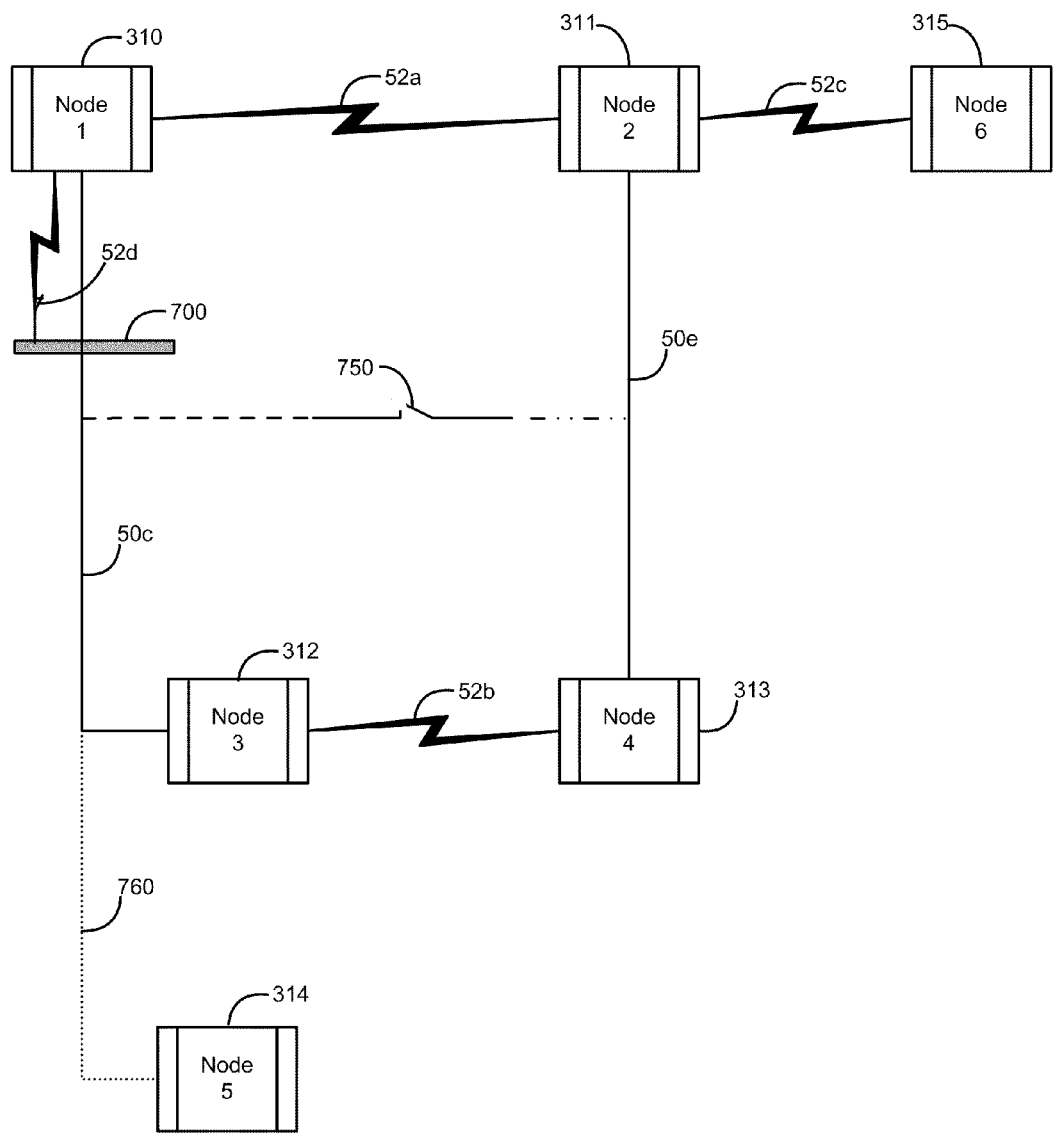
FIG. 6 depicts the relationship of communicating Management Nodes relative to potential problems in the communications network.

FIG. 6 illustrates the relative locations of the different management nodes 310-315 to potential interruptions or "breaks" 700, 750, 760 in the communications network of the present system, and exemplifies how the system can overcome such breaks. The present system utilizes a multiple-media network scheme to overcome "breaks" caused by issues such as signal interference and/or attenuation which may exist on any of the available communications interfaces. In the example shown, each management node 310-315 includes both a Power-Line Communications (PLC) communications interface 50, as well as a ZigBee wireless interface 52. The figure illustrates how the present system can handle communication of data ("packets") originating from "Node 1" 310, destined for "Node 2" to "Node 6" 311-315, though it is clear that this example can apply to packets originating from, or destined for, any of the other systems devices. Consider a data packet from "Node 1" 310 for transmission to "Node 2" 311. Under ideal circumstances, the data packet could be sent via either the Zigbee interface 52, or alternatively via the PLC interface 50 communicating over the power lines. In a first situation exemplified in FIG. 6, a "break" exists in that there is no direct power line connection between "Node 1" 310 and "Node 2" 311, thus preventing direct PLC communication between the two Nodes. Because the Zigbee com link 52a was successfully established, the data packet is still successfully sent from "Node 1" 310 to "Node 2" 311. In a second situation also exemplified in FIG. 6, a data packet from "Node 1" 310 is to be sent to "Node 3" 312. In this case, a "break" 700 exists in the wireless interface (e.g., a wall or other EM obstruction), disabling the Zigbee com link 52d. However, communications are still successful, as a direct PLC link 50c over the power line exists between "Node 1" 310 and "Node 3" 312, which link 50c can be selected based on criteria established by the node's associated ordering instructions. Further exemplified is the situation where a "break" exists on both PLC and Zigbee communications links between the nodes, as shown by lack of a direct wired or a wireless com link between "Node 1" 310 and "Node 4" 313. In this third case, no direct connection can be established between the two Nodes 310, 313, but because each Node has the ability to store, forward, relay, and/or repeat packets, alternate communications path are utilized by the system based on the criteria established by each node's associated ordering instructions and instruction for the system controller. Therefore, "Node 2" 311 can accept from "Node 1" 310 a data packet destined for "Node 4" 313, via the Zigbee interface 52a, and forward the packet to "Node 4" 313 via its PLC interface 50e. Similarly, a com link between "Node 1" 310 and "Node 4" 313 could be established through "Node 3" 312, using the PLC com link 50c to and the Zigbee com link 52b.

While the previous scenario describes receiving a packet on one interface, and forwarding the packet out a different interface, a similar behavior may occur on a single interface, wherein a management node has the effect of repeating and/or amplifying a communications signal. For example, interference could exists on the power line 760, such that the communications from "Node 1" 310 is severely attenuated, though not be completely blocked. In this case, "Node 3" 312 can accept the original data packet from "Node 1" 310 via the PLC com link 50c, and repeatedly send the packet via the PLC com link 760 to "Node 5" 314 until successful reception of the packet is acknowledged. Similarly, using Zigbee instead of PLC, this behavior can be shown between "Nodes 1" 310, "Node 2" 311, and "Node 6" 315. If a signal on the Zigbee wireless com link 52a is strong enough to reach from "Node 1" 310 to "Node 2" 311, but not to "Node 6" 315, then "Node 2" 311 can act as a repeater, resending over ZigBee com link 52c to establish successful communications between "Node 1" 310 and "Node 6" 315.

The System provides for the ability for any Management Node to be aware of the state of any other Node over the network, and thus an awareness of the overall state of the Network can be established. For example, if "Node 1" 310 has established successful communications via the ZigBee com link 52a with "Node 2" 311, and "Node 2" 311 subsequently goes "off-line" (e.g., experiences a software fault, loses power, is physically removed from the Network, or is otherwise unable to participate on the Network), then "Node 1" 310 is unable to communicate with Management "Node 2" 311. "Node 1" 310 is able to communicate this event to the remaining Nodes on the Network, which in turn may select alternate communications paths to accommodate the outage of "Node 2" 311. As an example of this, if "Node 4" 313 attempts to communicate with "Node 1" 310, it must do so via "Node 3" 312, as the path through "Node 2" 311 has been lost. However, having been informed of the outage in advance by "Node 1" 310, no time is wasted waiting for communication attempts via a path through "Node 2" 311 to time-out before trying an alternate com link.

Figure 7:
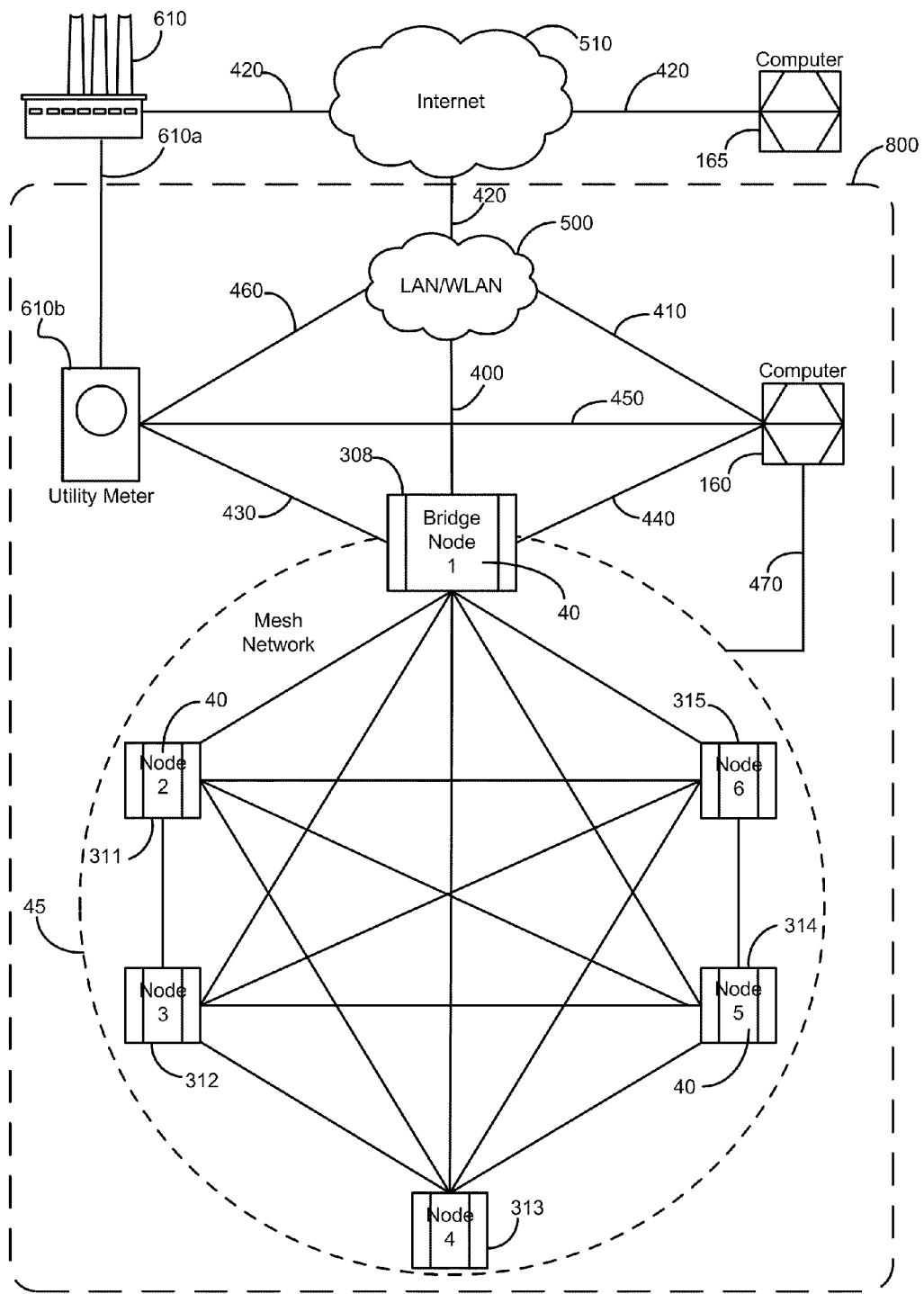
FIG. 7 illustrates the communications network in a mesh type configuration having a plurality of discrete networks within the present system.

FIG. 7 illustrates an embodiment of the present system 800 and the possible communications pathways and relative locations of the present system's management nodes 311-315 and other communicating devices, such as a network bridging device 308, "Smart" utility meter 610*b*, and Personal or Remote computer systems 160, 165. The described Personal and Remote computer systems 160, 165 may include any device capable of participating on a communication network, including "smart" or Internet-enabled cellular phones, WiFi appliances, Personal Data Assistants ("PDA's"), etc. The communications network 45, in this example, may be described as a "multiple-media, mesh network." Simply stated, any management node 311-315 may communicate with any other management node 311-315, or other participating networked device, such as a communications bridging device 308, or a personal computer 160. Intercommunication may be achieved via any of the multitude of communications interface available to a management node (FIG. 3A; 50, 52), wherein the interfaces may make use of differing media types, thus using "multiple-media." Additionally, management nodes 40 provide the software and processing means to store, relay, forward, and/or repeat communications data from one management node 40 to another, further enabling the mesh network functionality of the proposed system.

In addition to the multiple-media mesh network functionality described, the present system provides for multiple options for interoperability with other networks, for example, a typical computer-based network, such as a Local Area Network ("LAN") 500 or the Internet 510. Looking again to FIG. 7, the mesh network 45 formed by the management nodes 311-315 is illustrated. In this example, each management node 311-315 includes both a PLC 50 and a Zigbee 52 communications interface (see FIG. 3A) for participating on the network 45. Additionally, in this example, one networked smart devices 308 includes one or more Ethernet, USB, WiFi, and/or Home Area Network (HAN) interfaces allowing it to act as a communication "bridge" between different networks; storing, forwarding, relaying, and/or repeating communications data (packets) to and from the Mesh network 45 and to/from any number of external locations, such as a Personal Computer 160, a LAN 500, a utility meter 610*b*, the Internet 510, a remote computer 165, or the utility company 610. It should be noted that a bridging device 308 does not have to be a sensor. In examining this example, consider a data packet from the bridging device node 308 is in communication with a Personal Computer (PC) 160, which is located at the same premises at which the present System is installed. It can be seen that the bridging device node 308 can communicate with the PC 160 in a number of ways, including, but not limited to, a direct connection from the bridging management node 308 to the PC 160, such as USB or Ethernet cable 440; a connection through a LAN or wireless LAN ("WLAN") 500 via Ethernet or WiFi interfaces 400, 410; and/or a connection from the mesh Network 45 directly to the PC 160 via a PLC or Zigbee interface 470.

Now consider a packet from the bridging device node 308 destined for a remote, Internet-enabled computer 165. The bridging management node 308 can establish a connection to the Internet 510 using Ethernet or Wifi 400 via the LAN/WLAN 500, which in turn has an internet interface 420, and then to the remote computer 165 through the Internet 510. Optionally, the bridging management node 308 can establish a connection 440 to the local PC 160, which in turn connects to the LAN/WLAN 410, 500, which is similarly linked to the remote computer 165 via the Internet 510.

Communication with the Utility Service 610 may also be established to/from the bridging management node 310 via the Internet 510, proxied by an Internet based server 165 or by way of the utility meter 610*b*. The bridging Management Node 308 can, for example, communicate directly with an enabled utility meter 610*b* via a HAN interface 430, which is then in turn linked to the Utility Service 610 by way of their communication network 610*a*. Optionally, the utility meter 610*b* can have a connection 460 to the LAN/WLAN 500 or directly 450 to the PC 160, in which cases communications to/from the bridging management node 308 may be established as previously described. It should be understood that, though in the above examples of bridging communications between the mesh Network 45 and other networks or devices is done by a bridging device node 308, the bridging service may be accomplished by any device capable of bridging communications between the described mesh Network 45 and at least one other network.

Further, by forming a mesh type network, wherein each management node 308, 311-315 has a communication pathway to each other management node 308, 311-315, and each management node 308, 311-315 is capable of storing, forwarding, relaying, and/or repeating communications data, multiple pathways are available for the data communications. This further enables the system to overcome issues such as interference or attenuation by selecting alternate communications pathways. Additionally, whereas the Network 45 may be distributed in nature, the present system does not rely on any single management node 311-315 for normal operations. As such, the present system can accommodate and recover from individual management nodes 311-315 ceasing to participate on the Network 45. Similarly, the present system can accommodate the addition and dynamic integration of new management nodes 311-315 to the existing Network 45. It should be noted that it is not required that this communications bridge be comprised of a management node 40, per se.

Figure 8:
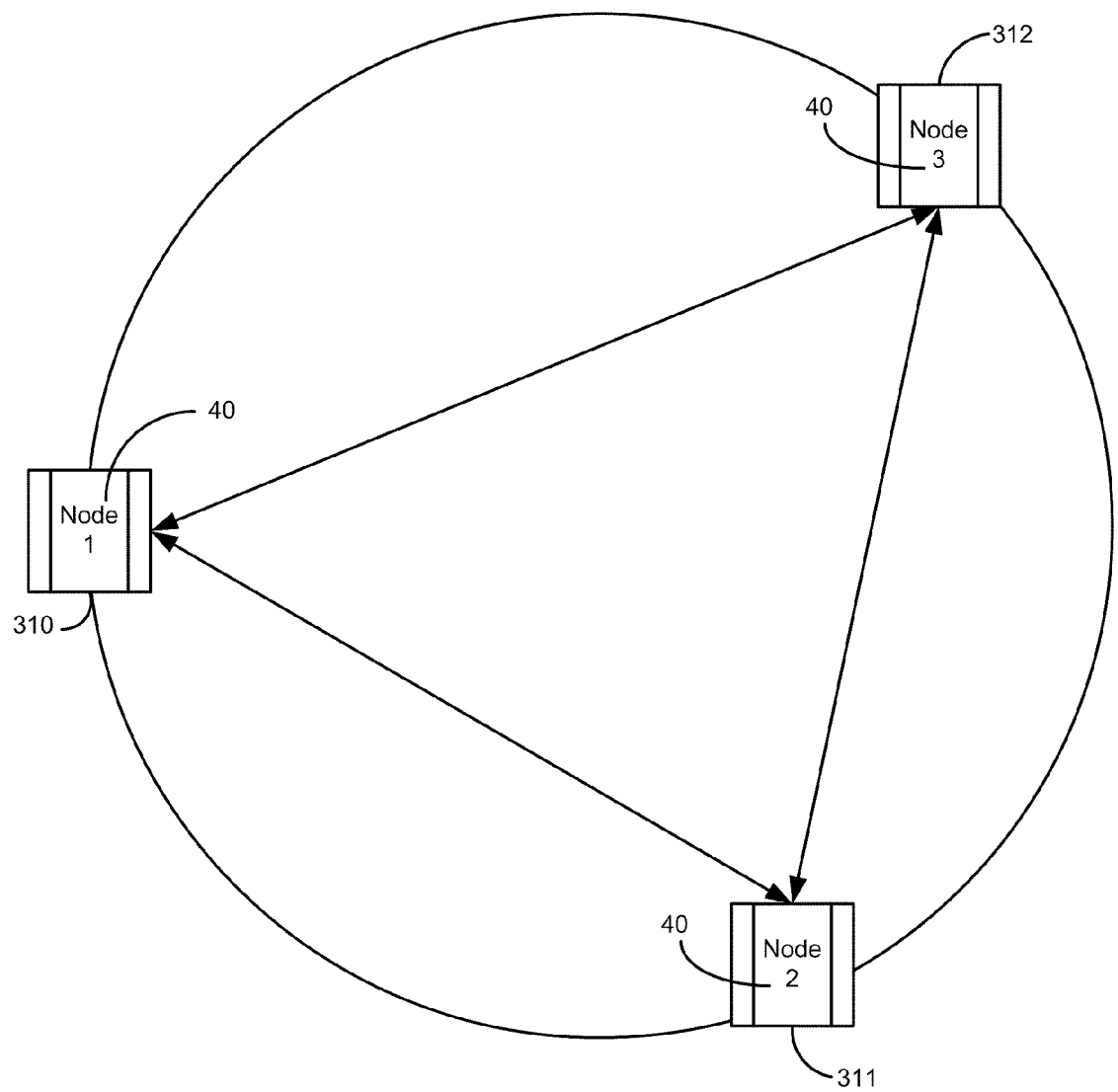
FIG. 8 illustrates the system's means of mapping the location of individual MNs relative to each other.

Looking now to FIG. 8, in addition to an awareness of the state of the Network and individual nodes 310, 311, 312, each management node 40 may calculate the relative distance to another management node 40. For example, in the figure "Node 2" 311 may measure the round-trip times of specific ZigBee communications to "Node 1" 310 and again to "Node 3" 312. By analyzing the timing values, "Node 2" 311 may calculate the relative distances to "Node 3" 312 and "Node 1" 310. Furthermore, by communicating these values to the other management nodes 40, which have in turn performed similar timing calculations, the system facilitates the generation of an overall map of the relative physical locations of the management nodes 40 in the Network.

Figure 9:
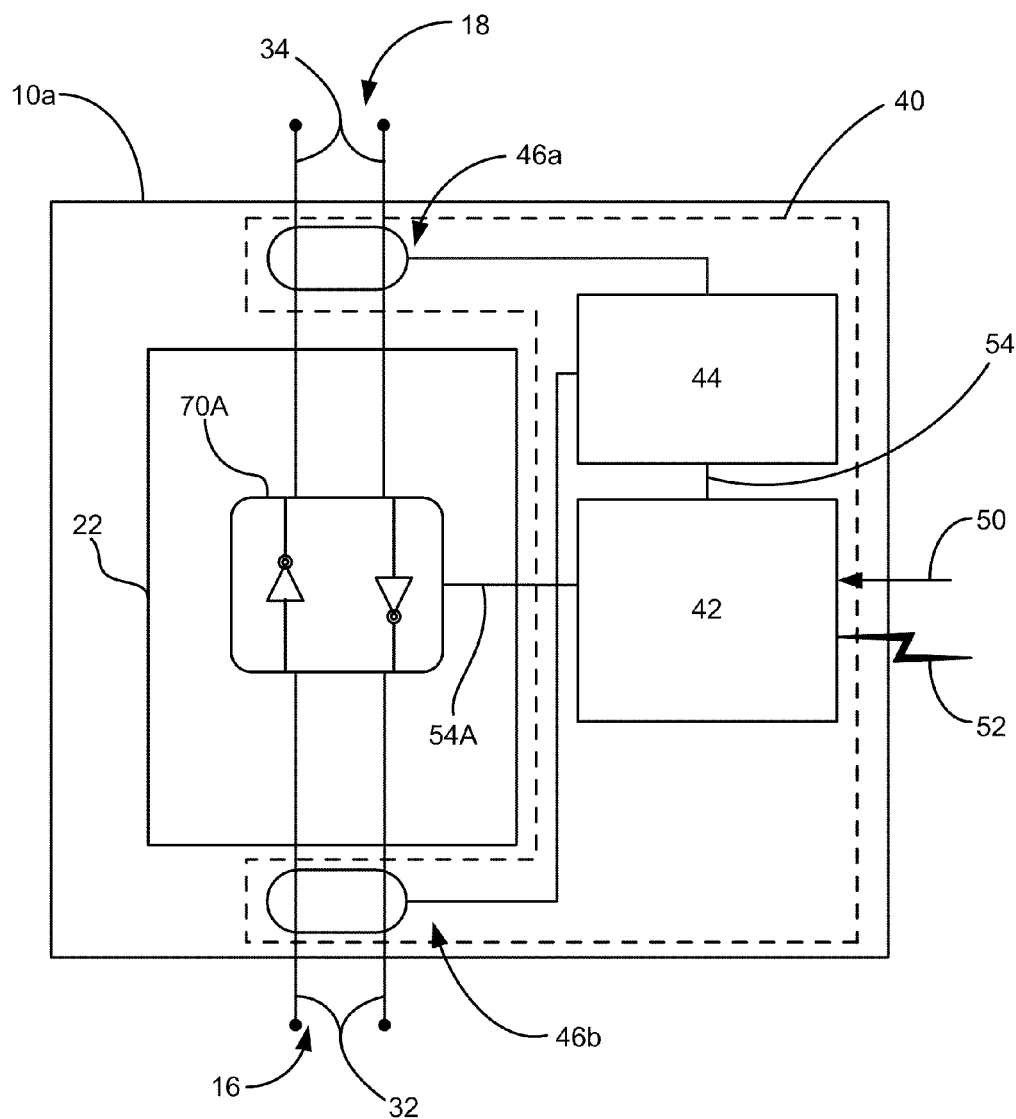
FIG. 9 is a schematic exemplifying a smart wire device having an inverter as a wiring-form.

A further feature of the present system addresses the issue that a modern premises micro-grid power management 800 system is not fully complete without the capability to include a "smart" inverter as a component of the system. A smart or condition responsive inverter allows the system's premises micro-grid 1 to have a local alternative power source feeding electricity into the system's micro-grid 1, which is responsive to the user's system—unlike the utility service provider 610 on the line side 610*a* of the utility meter 610*b* in FIG. 5). FIG. 9, illustrates a local power source component (not shown) having a local feed line 18 in electric communication with an input to a smart inverter 10*a*. The local power source in this embodiment is presumed to provide DC power, such as from a PV array or a battery bank, and the inverter 22 of the smart inverter 10*a* converts DC power to AC power in the system and is under the control of the user. In a preferred embodiment, the smart inverter 10*a* provides real-time measurements of electrical characteristics via a feed line sensor 46*a* disposed at the DC interface 34 of the local power feed line 18 of the inverter 22, and a micro-grid line sensor 46*b* at the AC interface 32 of the micro-grid power line 16. Additionally, the smart inverter management node 40 can communicate directly with the internal circuitry 70a of the inverter 22 via an integral serial communications interface Ma, to enable the communication of data in addition to data from the sensors 46a, 46b, such as: inverter circuitry state, inverter health, and diagnostic data related to the inverter circuitry. Further, via either or both of the bidirectional communication interfaces 50, 52, the smart inverter 10a can communicate with other smart devices 10 of the present system.

It should be noted that the inverter 22 in FIG. 9 can be substituted with a device such as a rectifier—converting AC power from the micro-grid line 16 to DC power at the feed line 18. In this case, the device 22 is operating as a rectifier; for charging DC power storage means (not shown), such as a battery bank or other DC power storage mechanism. Additionally, smart wire devices 10 incorporating both inverter and a rectifier capabilities may be practiced in the present invention.

While the above description contains many specifics, these should not be construed as limitations on the scope of the invention, but rather as exemplifications of one or another preferred embodiment thereof Many other variations are possible, which would be obvious to one skilled in the art. Accordingly, the scope of the invention should be determined by the scope of the appended claims and their equivalents, and not just by the embodiments.

What is claimed is:

1. A remotely controllable, condition sensing wire-device installable in an electric power line, for measuring an electrical property of said electric power line, said condition sensing wire-device comprising:
a current-carrying electrical appliance wiring-device, the appliance wiring-device having a locally controlled maker/breaker means for opening and closing said electric power line;
a management node, the management node including:
a control mechanism having a remotely controllable maker/breaker means separate from the locally controlled maker/breaker means of the electrical wiring-device, the remotely controllable maker/breaker means for controlling the condition of the control mechanism, in response to a internal device signal from a communications circuit;
a sensing circuit in electrical communication with said electric power line and the control mechanism, the sensing circuit measuring said electrical property of said electrical line and communicating an internal device signal of a result of the measuring and the sensing;
a communications circuit adapted to receive, process and route internal device signals, and to transmit external output signals and receive external input signals from a spatially separated, remote signal device via an I/O interface port; and
the management node physically integrated with the electrical appliance wiring-device to provide said condition sensing wire-device in a unitary form.

2. The remotely controllable, condition sensing wire-device of claim 1, wherein the electrical appliance wiring-device is a consumer-appliance electrical circuit maker/breaker for connecting an electrical consumer-appliance to said electrical power line, the consumer-appliance electrical circuit maker/breaker having a form selected from the group of appliance wiring-device forms consisting of: an electrical appliance outlet; a surface-mount electrical appliance switch; and an electrical circuit breaker.

3. The remotely controllable, condition sensing wire-device of claim 1, wherein said electric power line is a residential-type consumer premises drop-side of an electrical utility service.

4. The remotely controllable, condition sensing wire-device of claim 1, wherein the sensing circuit of the management node includes a line sensor adapted to enable the sensing circuit to measure at least one electrical property of the electric power line.

5. The remotely controllable, condition sensing wire-device of claim 1, wherein the sensing circuit of the management node includes a self-sensor adapted to enable the sensing circuit to sense a condition of the control mechanism.

6. The remotely controllable, condition sensing wire-device of claim 1, wherein the sensing circuit of the management node includes a line sensor adapted to enable the sensing circuit to measure at least one electrical property of the electric power line selected from the group of electrical properties consisting of: line current; line voltage; line frequency; electrical ground condition; wattage; line power factor; line electrical noise; and line impedance.

7. The remotely controllable, condition sensing wire-device of claim 1, wherein the remotely controllable maker/breaker means of the control mechanism is operable in response to an internal device signal from the communications circuit to control the condition of the control mechanism by opening and closing a node portion of said electrical power line.

8. The remotely controllable, condition sensing wire-device of claim 1, wherein the remotely controllable maker/breaker means of the control mechanism is operable in response to an internal device signal from the communications circuit to alter said electrical property of said electrical power line without opening/breaking a node portion of said electrical power line.

9. The remotely controllable, condition sensing wire-device of claim 1, wherein the remotely controllable maker/breaker means of the control mechanism is operable in response to an internal device signal from the communications circuit to alter said electrical property of said electrical power line by opening/breaking a node portion of said electrical power line for less than a full duty-cycle.

10. The remotely controllable, condition sensing wire-device of claim 1, wherein the communications circuit is adapted to transmit and to receive external signals via a wire I/O interface.

11. The remotely controllable, condition sensing wire-device of claim 1, wherein the communications circuit is adapted to transmit and to receive external signals via a wireless I/O interface.

12. The remotely controllable, condition sensing wire-device of claim 1, wherein the communications circuit is adapted to transmit and to receive external signals via at least two communication interfaces selected from the group of interfaces consisting of: a wire I/O interface and a wireless I/O interface.

13. The remotely controllable, condition sensing wire-device of claim 1, wherein the management node includes a manual override mechanism, the manual override mechanism having a user interface disposed on the Smart Wire Device to be accessible to a user, and adapted to allow the user to alter the condition of the management node.

14. The management node of claim 13, wherein the override mechanism is selected from the group of mechanisms consisting of: an electronic override circuit and a mechanical override.

15. The management node of claim 13, wherein the override mechanism includes a tell-tale to indicate a current setting of the override mechanism.

16. The remotely controllable, condition sensing wire-device of claim 1, wherein the spatially separated, remote signal device in communication with the communications circuit is a system controller device.

17. The remotely controllable, condition sensing wire-device of claim 1, wherein the spatially separated, remote signal device in communication with the communications circuit is another Smart Wire-Device.

18. The remotely controllable, condition sensing wire-device of claim 1, wherein the current-carrying electrical appliance wiring-device is an electrical inverter in electrical communication with a local power feed line and a micro-grid power line, the inverter providing an interface between the local power feed line and the electric power line; and wherein the sensor circuit of the management node includes at least a feed line sensor measuring a condition of the power feed line, and a micro-grid line sensor measuring a condition of the micro-grid power line.

19. The smart inverter wire device of claim 18, wherein the management node communicates directly with the internal circuitry of the inverter via an integral serial data port, providing the ability to communicate data in addition to data from the sensors.

\* \* \* \* \*